(12) United States Patent
Kaji et al.

(10) Patent No.: US 6,933,500 B2
(45) Date of Patent: Aug. 23, 2005

(54) ELECTRON MICROSCOPE

(75) Inventors: Kazutoshi Kaji, Tokyo (JP); Shohei Terada, Tokyo (JP); Tadashi Otaka, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/620,958

(22) Filed: Jul. 16, 2003

(65) Prior Publication Data

US 2004/0094712 A1 May 20, 2004

(30) Foreign Application Priority Data

Nov. 18, 2002 (JP) ........................................ 2002-333020

(51) Int. Cl.[7] ................................................. H01J 27/26
(52) U.S. Cl. ........................ 250/311; 250/307; 250/399
(58) Field of Search ............................... 250/311, 307, 250/399, 397, 310, 396 R

(56) References Cited

U.S. PATENT DOCUMENTS

| | | | |
|---|---|---|---|
| 4,812,652 A | * 3/1989 | Egle et al. | .................. 250/311 |
| 5,097,126 A | 3/1992 | Krivanek | |
| 5,640,012 A | 6/1997 | Krivanek | |
| 5,798,524 A | 8/1998 | Kundmann et al. | |
| 6,140,645 A | * 10/2000 | Tsuno | .......................... 250/311 |
| 6,150,657 A | * 11/2000 | Kimoto et al. | ............... 250/305 |
| 6,384,412 B1 | * 5/2002 | Krahl et al. | ................. 250/305 |
| 6,495,826 B2 | * 12/2002 | Tsuno | ......................... 250/305 |
| 6,624,412 B2 | * 9/2003 | Tanaka et al. | .............. 250/305 |
| 2001/0052744 A1 | * 12/2001 | Tsuno | ......................... 313/364 |

FOREIGN PATENT DOCUMENTS

| | | |
|---|---|---|
| JP | 58-032347 | 2/1983 |
| WO | WO 01/82330 A1 | 11/2001 |

* cited by examiner

*Primary Examiner*—Nikita Wells
*Assistant Examiner*—Anthony Quash
(74) *Attorney, Agent, or Firm*—Hogan & Hartson, LLP

(57) ABSTRACT

An electron microscope is provided, which enables an observation with high resolution. The electron microscope is able to detect the deviation of an electron beam relative to the opening of a slit quantitatively, thereby shifting the electron beam accurately to the center of the opening of slit so as to execute energy selection. The electron microscope has an energy filter control unit for adjusting a relative position between an electron beam and a slit by shifting the position of electron beam based on a signal delivered by an energy filter electron beam detector. Also a method for controlling an energy filter is provided, which includes the steps of shifting the position of an electron beam, determining the position of electron beam and letting the electron beam pass through the center of an opening of the slit by controlling the position of slit or position of electron beam.

10 Claims, 8 Drawing Sheets

ELECTRON MICROSCOPE

FIELD OF THE INVENTION

The present invention relates to an electron microscope having an energy filter and a method thereof for observation of a specimen.

BACKGROUND OF THE INVENTION

Observation with an electron microscope has been playing an important role in an analysis of micro constituents as a result of the recent development in the areas such as semiconductor devices and magnetic head elements, which have been experiencing continuous improvement in size toward minuteness. It is known that the spatial resolution of an electron microscope can be improved by decreasing the energy width of an incident electron beam with an energy filter, which is also called a monochromoter, so as to narrow an electron beam probe.

U.S. Pat. No. 5,097,126 discloses an energy filter which can adjust and stabilize the position of an electron beam on a slit, which has a sensor capable of detecting the electron beam, such as a fluorescent material which is able to detect a difference of intensity of an incident electron beam.

Also another U.S. Pat. No. 5,798,524 discloses an electron microscope, in which a predetermined percentage of an electron beam passing through the opening of a slit is defined and an automatic adjustment is performed for the electron microscope if the electron beam falls below the predetermined value. The automatic adjustment such as focusing of spectrum has the following steps: comparing the amounts of incident electron beam on upper and lower slit haves respectively; shifting the electron beam away from a slit half intercepting the greater amount and toward the other slit half intercepting the lesser amount; measuring the integrated intensity of an image of electron beam; and analyzing the surface plot of intensity.

Furthermore, the other U.S. Pat. No. 5,640,012 discloses an apparatus, in which the width of an opening of slit is controlled by shifting one of slit halves with an actuator according to an output signal detected by a light detector, which detects the light passing through the opening of slit.

As the width of the opening of slit is as small as some micron meters, it is difficult to let an electron beam pass through the center thereof.

Even after the electron beam passes through the opening successfully, a position of electron beam on the slit shifts due to the effect of instability of an electron beam source and the like, so that the electron beam is intercepted, which results in difficulty of observation with high resolution.

The apparatus according to the U.S. Pat. Nos. 5,097,126 and 5,798,524 is not able to compensate a deviation when the electron beam is dislocated so away from the opening of slit that the electron beam lies on a slit half. On the other hand, U.S. Pat. No. 5,640,012, which discloses a technique for controlling the width of a slit accurately, does not refer to another technique for controlling a position of electron beam on the slit so that the electron beam is positioned in the center of the opening of slit.

SUMMARY OF THE INVENTION

An electron microscope according to the present invention enables an observation with high resolution, in which the deviation of an electron beam relative to the opening of a slit is detected quantitatively and the electron beam is shifted accurately to the center of the opening of slit so as to execute energy selection.

The electron microscope has an energy filter control unit for adjusting a relative position between an electron beam and a slit by shifting the position of electron beam based on a signal delivered by an energy filter electron beam detector.

Also a method for controlling an energy filter is provided, which includes the following steps: shifting the position of an electron beam; determining the position of electron beam according to an amount thereof, which has passed through a filter and is detected by an electron beam detector; and letting the electron beam pass through the center of an opening of the slit by controlling the position of slit or position of electron beam. The method provides a technique which enables regular detection of a deviation by shifting an electron beam from a position where the electron beam is intercepted by the slit to the other position where the electron beam is intercepted again after traversing the opening of slit. The method also provides an alternative technique for performing regular detection, which employs cyclical shifting of an area on the slit illuminated by the electron beam. Cyclical shifting in this case, for example, refers to shifting of a position of electron beam back and forth relative to the initial position on the slit in a direction of the width of opening.

An electron microscope according to the present invention, which is able to selectively turn on or off an energy dispersion section, allows an electron beam with energy dispersion to pass through a slit while the energy dispersion section is on, or allows an electron beam without energy dispersion to illuminate a specimen directly while off.

An electron microscope disclosed in U.S. Pat. No. 5,097,126 has a slit whose location is fixed in the trajectory of an electron beam independent of the operation of energy filter. In this way, the electron microscope, in which the electron beam passes through the slit even if the energy filter is not in operation, inevitably decreases an amount of electron beam, thereby lowering contrast in an obtained image. On the other hand, an electron microscope according to the present invention, which has switching of an energy dispersion section, enables a type of observation of specimen with high contrast and speed and the other type with high resolution as well, which can be selected by simple switching.

DESCRIPTION OF THE PREFERRED EMBODIMENTS

Figure 1:
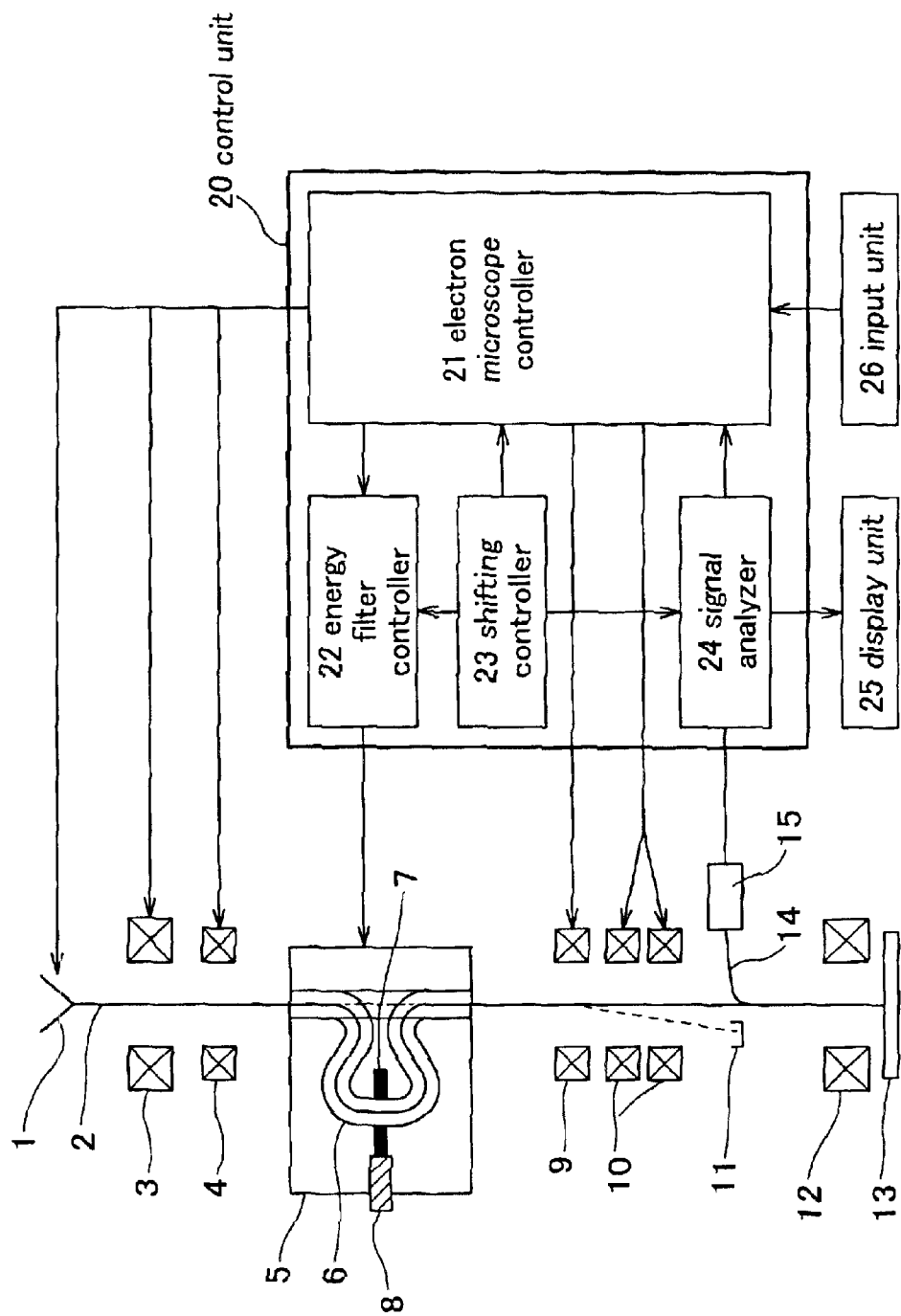
FIG. 1 is a schematic diagram showing major parts of an electron microscope according to an embodiment of the present invention.
Figure 2:
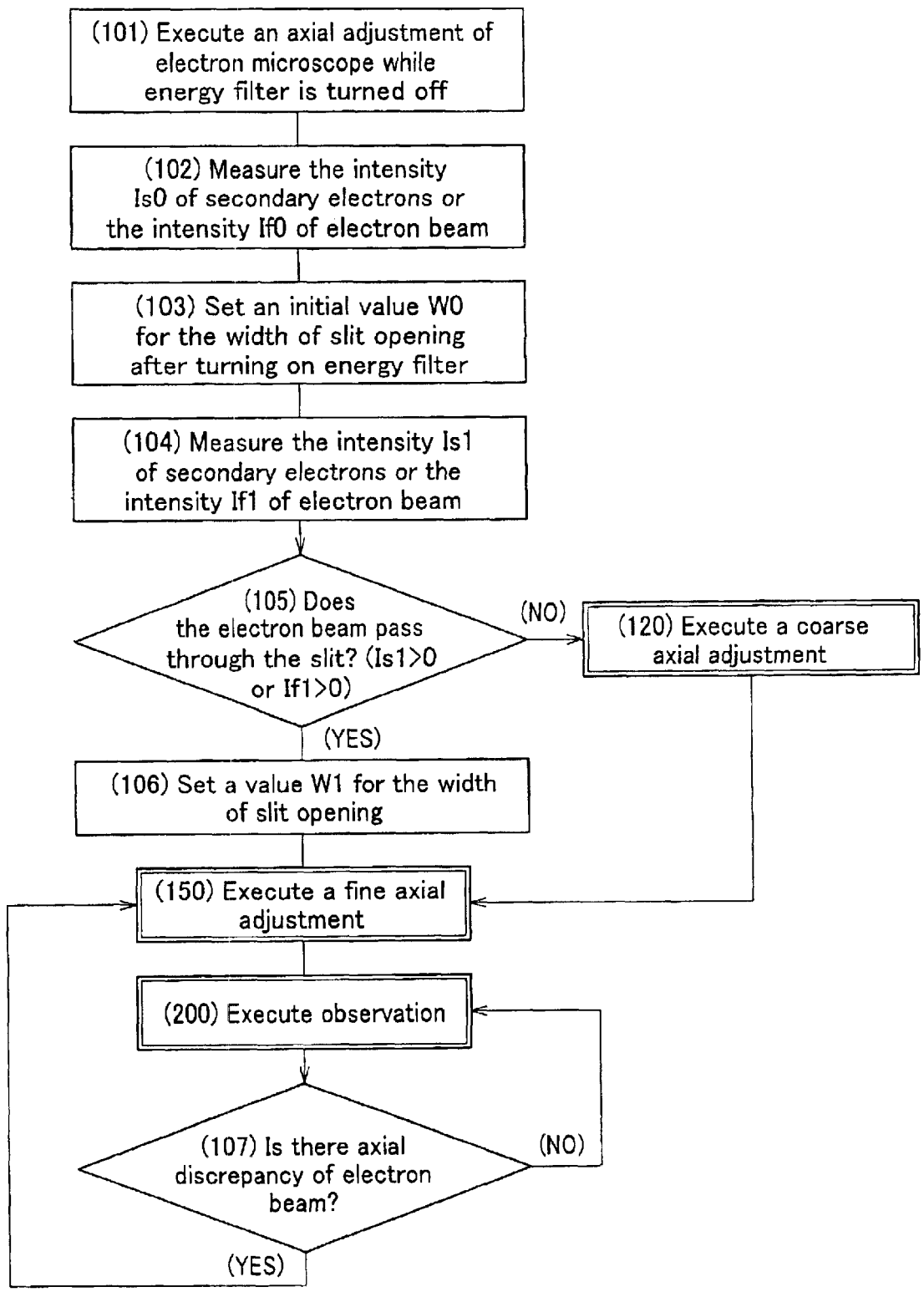
FIG. 2 is a flow diagram showing an example of adjustment of an electron microscope from axis adjustment to observation according to an embodiment of the present invention.

Electron microscopes are categorized as a scanning electron microscope (SEM), a transmission electron microscope (TEM) and a scanning transmission electron microscope (STEM).

An energy filter imposes a magnetic or electric field on an incident charged particle such as an electron beam so that the particle experiences energy dispersion, thereby taking out a portion of the electron beam having a desirable energy width with a slit disposed on an energy dispersion plane. An energy filter mainly includes an energy dispersion section for causing energy dispersion, a slit having an opening for letting an electron beam pass through with a width of some micron meters to some ten millimeters in a direction of energy dispersion and a dispersion controller for controlling the intensity of magnetic or electric field of the energy dispersion section.

SEM and TEM require a reduced electron probe in order to improve spatial resolution. An energy filter, which performs energy dispersion for an electron beam emitted by an electron beam source and selection of electron beam with a slit, can narrow the energy width of electron beam and the electron probe.

TEM and STEM, which perform energy dispersion for an electron beam having transmitted through a specimen and select a portion of the electron beam with a slit, focus an image with the selected portion by which an observation of the specimen is conducted. An electron beam experiences energy loss intrinsic to an element, namely electronic structure as a result of interaction with elements of a specimen while the electron beam transmits through the specimen. An electron energy loss spectroscopy (EELS), which conducts energy analysis for electrons having transmitted through a specimen by an electron spectroscope, can provide analysis for elements contained in the specimen. Furthermore, an energy shift of some electron volts appears, resulting from difference in chemical bonding, especially difference in electronic structure of an element. Therefore, EELS is able to perform measurement with high resolution if accurate selection of electron beam is accomplished.

An electron microscope according to the present embodiment has an electron beam source, an energy filter, an energy filter detector, an electron beam shifting controller, a slit shifting controller and a control unit. The electron beam source generates an electron beam. The energy filter has an energy dispersion section for dispersing the energy of electron beam and a slit for selection of the energy of dispersed electron beam. The energy filter detector detects the electron beam selected by the energy filter. The electron beam shifting controller is able to control the electron beam on the slit cyclically. The slit shifting controller is able to control the position of slit cyclically. The control unit controls the position of electron beam in the slit based on an output signal delivered by one of the electron beam shifting controller and slit shifting controller.

The electron microscope includes a scanning electron microscope (SEM) or a scanning transmission electron microscope (STEM), which has a scanning coil between a slit and a specimen for scan an electron beam having passed through the slit, or a transmission electron microscope (TEM) which has a specimen downstream the slit relative to a direction of traveling of the electron beam. The present invention can provide an image of high spatial resolution obtained by an electron microscope.

Also the electron microscope includes a transmission electron microscope (TEM) or a scanning transmission electron microscope (STEM), which has one of specimen stage and holder for setting a specimen between an electron beam source and an energy dispersion section. The present invention can provide element analysis or chemical bonding analysis with high accuracy.

Next, description is made for a method according to the present invention.

The electron microscope according to the present invention is able to shift an electron beam on a slit cyclically or shift at least one of upper and lower shields cyclically so that the position of electron beam can be controlled. A method associated with controlling the electron microscope has the following steps. A change in an electron beam is measured, for example in terms of period and amplitude of the intensity of electron beam, responsive to a cyclical change in the position of electron beam. Then, the position of electron beam is determined in detail based on the intensity of electron beam having passed through the opening of slit or the intensity of secondary electrons emitted by a specimen illuminated by the electron beam.

Also, the method has a step of measuring a change in the intensity of electron beam when the electron beam or slit is shifted in one direction, so that the position of electron beam can be determined. In this connection, being shifted in one direction means that shifting of an electron beam starts at one shield and stops at the other shield traversing an opening of slit. It is also described differently that the slit is shifted so that the electron beam is intercepted, passes through the opening and intercepted again.

The electron microscope is able to detect the position of electron beam on the slit accurately based on measurement results of the intensity of electron beam, thereby shifting the electron beam to the center of the opening of slit. In this way, the electron microscope can restrict a decrease in the intensity of electron beam, thereby extracting the electron beam having higher energy resolution or a narrow energy width.

In an electron microscope of conventional technique, an electron beam having passed through a specimen has an energy distribution due to inelastic scattering with the specimen. An electron beam is selected from the energy distribution by an energy filter having an energy dispersion section and a slit. In this way, an observation is made for an image of electron microscope or a spectrum of electron energy loss spectroscopy (EELS) using the selected electron beam. On the other hand, an electron microscope according to the present invention is able to control to keep a position of electron beam in the center of an opening of slit accurately, thereby providing an observation with higher energy resolution for an image or a spectrum of electron microscope.

A method according to the present invention for adjusting an electron microscope for observation of a specimen has steps which enable an accurate control for positioning an electron beam in the center of an opening of slit. The steps include: shifting the position of electron beam cyclically or shifting at least one of shields cyclically and detecting the electron beam having passed through the opening of slit or second electrons emitted by the specimen illuminated by the electron beam. The method for controlling the beam position allows illuminating the specimen with the electron beam of a narrow energy width, which has passed through an energy filter. Or the method permits illuminating a specimen with an electron beam probe of a small diameter, using the electron beam of a narrow energy width. In this way, the method achieves observation of a specimen with higher spatial resolution.

The method according to the present invention has a feature that a position of electron beam on the slit is controlled based on at least one of the period and amplitude of an output signal detected by an electron beam detector, comparing the period with another period of an output signal delivered by a shifting controller which controls cyclical shifting of the electron beam on the slit.

The method described above can be applied to an electron beam which transmits through a specimen. The method is thus applicable to a transmission electron microscope, in which an electron beam can be observed that has undergone energy selection and transmitted through the specimen.

An electron microscope according to the present invention has a feature that a slit is disposed away from the trajectory of electron beam when an energy dispersion section of energy filter is turned off. This allows an adjustment of electron trajectory from an electron beam source to a specimen without the slit, thereby simplifying the steps associated with axis adjustment. Furthermore, the electron microscope facilitates selection for different types of observation by introducing simple switching. One is an observation which does not require an energy filter and the other is an observation requiring an energy filter to acquire high spatial resolution with an electron beam having a narrow energy width.

a. Electron Microscope

An embodiment of an electron microscope according to the present invention is now described in detail referring to the accompanying drawings.

FIG. 1 is a schematic diagram illustrating major parts of a scanning electron microscope having an energy filter according to the embodiment of the present invention. An electron beam 2 generated by an electron beam source 1 is converged by a condenser lens 3 and then directed to an energy filter 5. The energy filter 5 includes an energy dispersion section 6 and a slit 7 disposed on a dispersion plane of electron beam. The slit 7 is coupled with a slit adjuster 8. Magnets or electrodes in the energy dispersion section 6 produce a magnetic or electric field, which is in an out-of-plane direction in FIG. 1, thereby dispersing the electron beam according to the energies. Any type of energy dispersion section may be selected other than the configuration shown in FIG. 1 as long as it can disperse energy of an electron beam.

When the energy filter 5 is in operation, an electron beam undergoes dispersion caused by a magnetic field generated by the energy dispersion section 6. The electron beam selected by the slit 7 is thus emitted from the energy filter 5. On the other hand, when the energy filter 5 is not in operation, the energy dispersion section 6 does not generate a magnetic field and thereby the electron beam 2 travels straight out of the energy filter 5.

An objective lens 12 forms a probe on a specimen 13 with the electron beam coming out of the energy filter 5. An electron beam scanning coils 10 scans the electron beam on the specimen 13 in two dimensions and a secondary electron detector 15 detects secondary electrons 14 emitted by the specimen 13. In this way, an image of secondary electrons of the specimen 13 is shown on a display unit 25.

The electron microscope according to the present embodiment has also an energy filter electron beam detector 11 for measuring an electron beam coming out of the energy filter 5. Furthermore, the electron microscope has a deflection coil 9 for guiding the electron beam into the energy filter electron beam detector 11 or for correcting the trajectory of electron beam coming out of the energy filter 5.

A control unit 20, to which an input unit 26 is electrically connected, has an electron microscope controller 21, an energy filter controller 22, a shifting controller 23 and a signal analyzer 24. The electron microscope controller 21 controls the conditions for acceleration of electron in the electron beam source 1 and the conditions for setting of coils. The energy filter controller 22 controls the energy filter 5, which includes coils for generating a magnetic field or electrodes for generating an electric field for the energy dispersion section 6. The shifting controller 23 generates modulation signals for controlling a position of electron beam on a slit 7 or a position of at least one of upper and lower shields 31, 32. The signal analyzer 24 analyzes the position of electron beam on the slit 7 based on an output signal delivered by the secondary electron detector 15 or energy filter electron beam detector 11 as well as an output signal delivered by the shifting controller 23.

Figure 6:
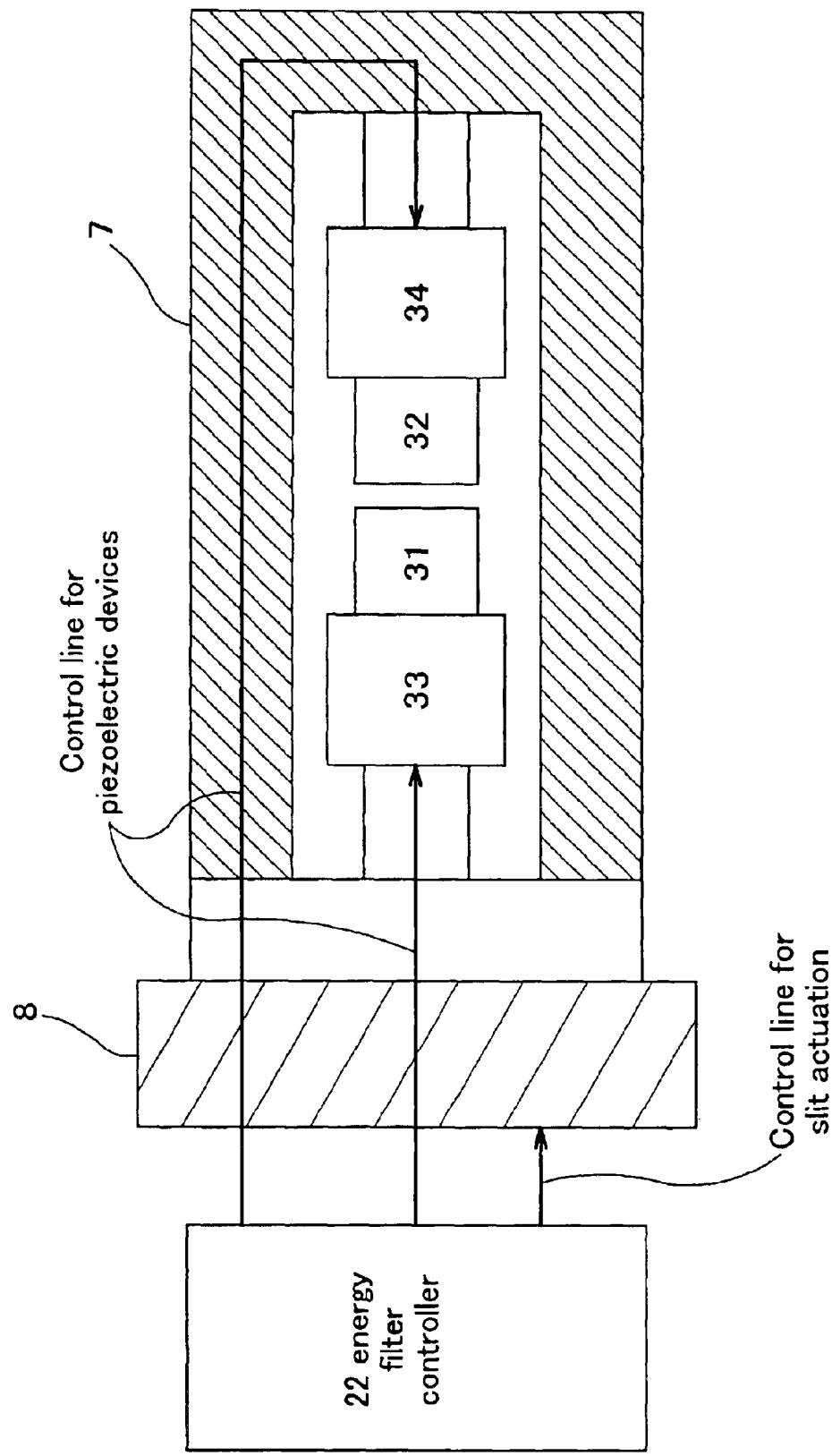
FIG. 6 is a diagram showing an example of slit shown in FIG. 1.

The conditions for acceleration of electron in the electron beam source 1, the magnetic or electric field intensity of the energy dispersion section 6 or a deflection coil 4, which is disposed between the condenser lens 3 and the energy filter 5, can be used for controlling of a position of electron beam on the slit 7. As shown in FIG. 6, the slit 7 according to the present invention is able to adjust the position of electron beam. The slit 7 has a pair of upper and lower shields 31, 32 and a pair of piezoelectric devices 33 and 34. At least one of upper and lower shields 31, 32 is connected to one of piezoelectric devices 33 and 34. The adjustment is performed in such a manner that the piezoelectric devices 33 and 34 are controlled according to the output signal delivered by the shifting controller 23 so that whole slit 7 can be shifted or the width of an opening of slit 7 can be controlled.

The slit 7 is placed so that the electron beam can bypass the slit 7 when the energy filter 5 is turned off. In this way, the electron microscope is able to provide a measurement with higher contrast and a substantial amount of electron beam if such a measurement without energy dispersion is desired. An observation with high resolution, which requires a narrow energy width of electron beam, brings reduction in the contrast of an image due to decrease in an amount of electron beam. The electron microscope according to the present invention is thus able to provide flexibility in observation to select a high speed and contrast observation or a high resolution observation. In this connection, the selection can be done by simple switching.

b. Method for Adjusting an Electron Microscope for a High Contrast Observation

Next, an embodiment of method for adjusting an electron microscope for observation of a specimen according to the present invention is described referring to FIGS. 2, 3, 4 and 5.

As described above, the electron microscope according to the present invention is able to perform a measurement with a substantial amount of electron beam by turning off an energy filter 5. First, an adjustment of axis of the electron microscope is performed while the energy filter 5 is turned off (Step 101). Since a magnetic field is not imposed on an energy dispersion section 6 while the energy filter 5 is turned off, an incident electron beam travels straight, leaving out of the energy filter 5. After completion of step 101, a measurement of the intensity $Is0$ of secondary electrons emitted by a specimen 13 using a secondary electron detector 15 or the other measurement of the intensity $If0$ of electron beam using an energy filter electron beam detector 11 is performed (Step 102). When the intensity If0 of electron beam is measured, a deflection coil 9 controls the trajectory of electron beam so that the electron beam is directed to the energy filter electron beam detector 11.

c. Method for Adjusting an Energy Filter

The width of an opening of a slit 7 in an energy filter 5 is set to be an initial value W0 (Step 103). The initial value W0 can be selected so that the width is large enough to let every dispersed electron beam pass through the opening of slit 7, for example. Setting the initial value W0 for the width of opening of slit 7, the intensity Is1 of secondary electrons is measured by a secondary electron detector 15 or the intensity If1 of electron beam is measured by an energy filter electron beam detector 11 (Step 104). If the measured intensity Is1 or If1 is equal to or greater than zero (Step 105), the width of the opening of slit 7 is set to be a desired value W1 (Step 106). If Is1 or If1 is approximately equal to zero, which means that the slit 7 intercepts almost all the electron beam and very small amount thereof passes through the energy filter 5, a coarse adjustment for the axis of energy filter 5 should be performed (Step 120).

d. Method for Coarse Adjustment of Axis for an Energy Filter

Figure 3:
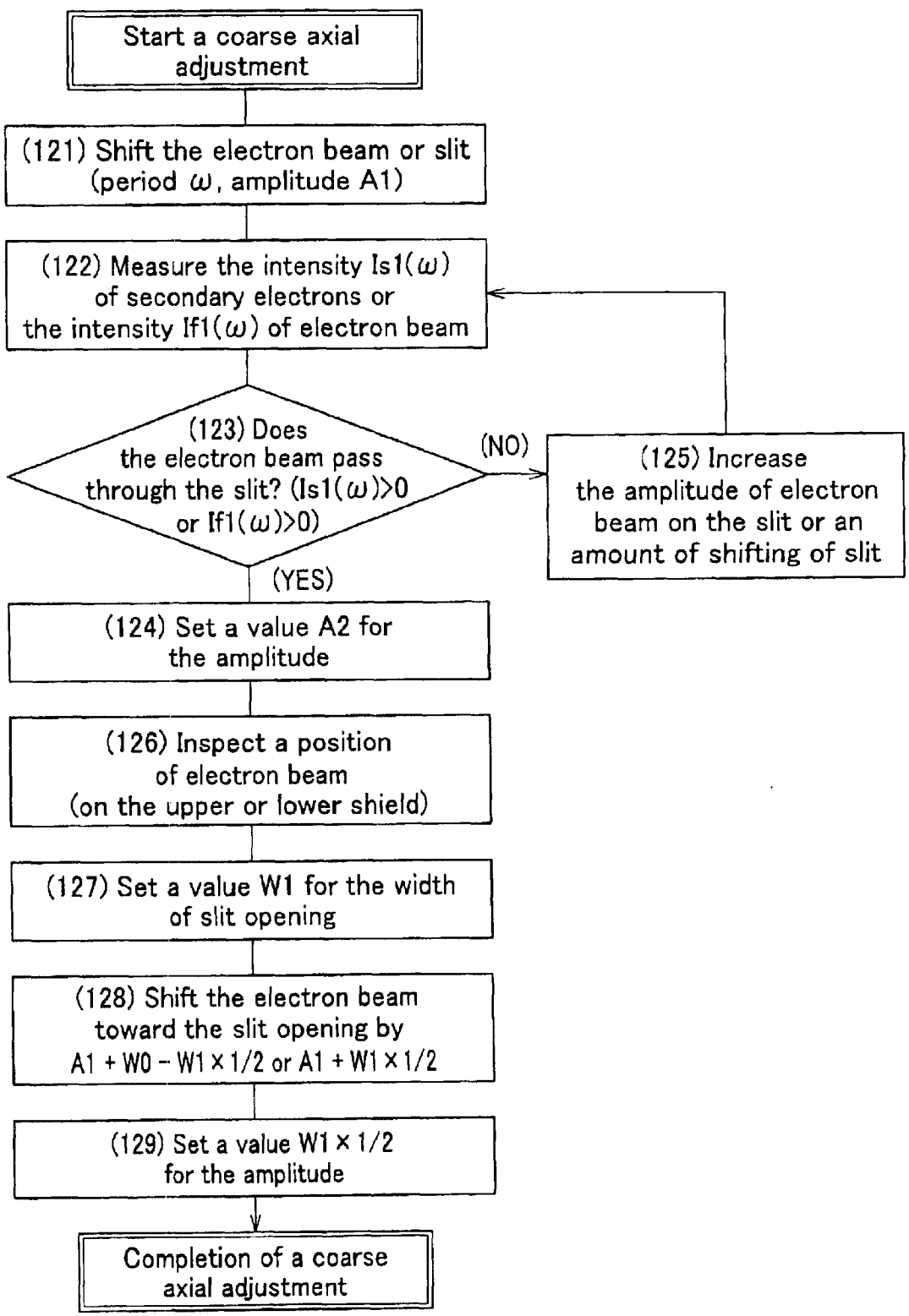
FIG. 3 is a flow diagram showing an example of coarse adjustment shown in FIG. 2.

An embodiment of a method for coarse adjustment of axis for an energy filter 5 is described referring to FIG. 3.

An electron beam on a slit 7 or at least one of upper and lower shields 31 and 32 is shifted with a period $\omega$ and amplitude A1 (Step 121). The intensity Is1 ($\omega$) of secondary electrons is measured by a secondary electron detector 15 or the intensity If1 ($\omega$) of electron beam is measured by an energy filter electron beam detector 11 (Step 122). The amplitude A1 is increased until Is1 ($\omega$) or If1 ($\omega$) reaches equal to or greater than zero (Steps 123, 125) and an amplitude at this timing is denominated A2. It is determined on which one of the upper and lower shields 31, 32 the electron beam exists, by analyzing the intensity Is1 ($\omega$) or If1 ($\omega$) (Step 126). Then, the width of opening of slit 7 is set to be the predetermined value W1 (Step 127). The position of electron beam on the slit 7 is shifted toward the opening by a distance of $\delta X$ (Step 128). $\delta X$ is determined in the following manner. If the distance between the position of electron beam on the slit 7 and the opening thereof does not change after executing Step 127, $\delta X$ should be set according to the equation: $\delta X = A2 + W1 \times \frac{1}{2}$. If the distance increases, for example by W0–W1, $\delta X$ should be set according to the equation: $\delta X = A2 + W0 - W1 \times \frac{1}{2}$. A coarse adjustment of axis completes by setting amplitude of 2×W1 for shifting of the position of electron beam on the slit 7 or shifting of at least one of the upper and lower shields 31, 32 (Step 129).

e. Method for Fine Adjustment of Axis for an Energy Filter

Figure 4:
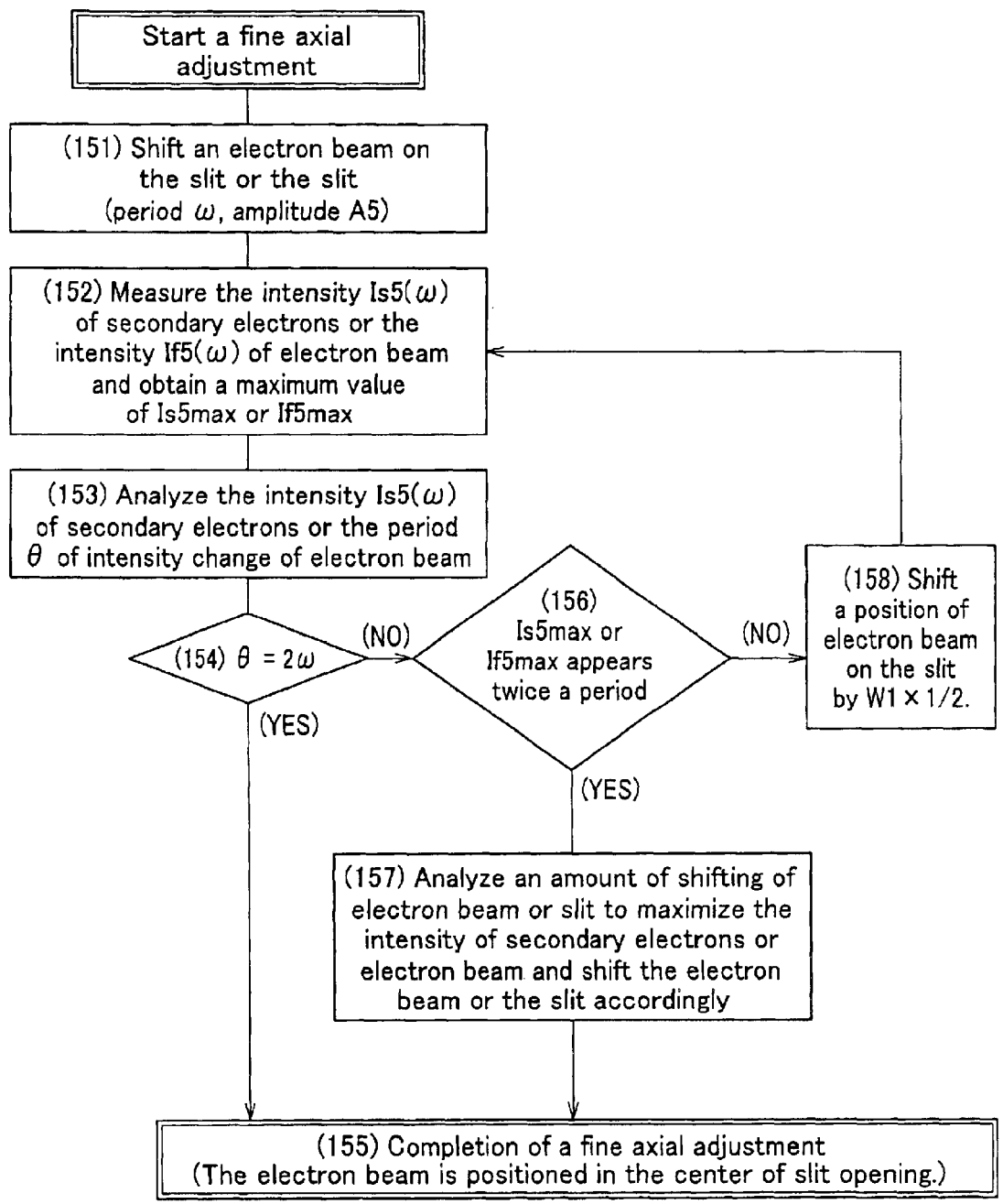
FIG. 4 is a flow diagram showing an example of fine adjustment shown in FIG. 2.
Figure 5:
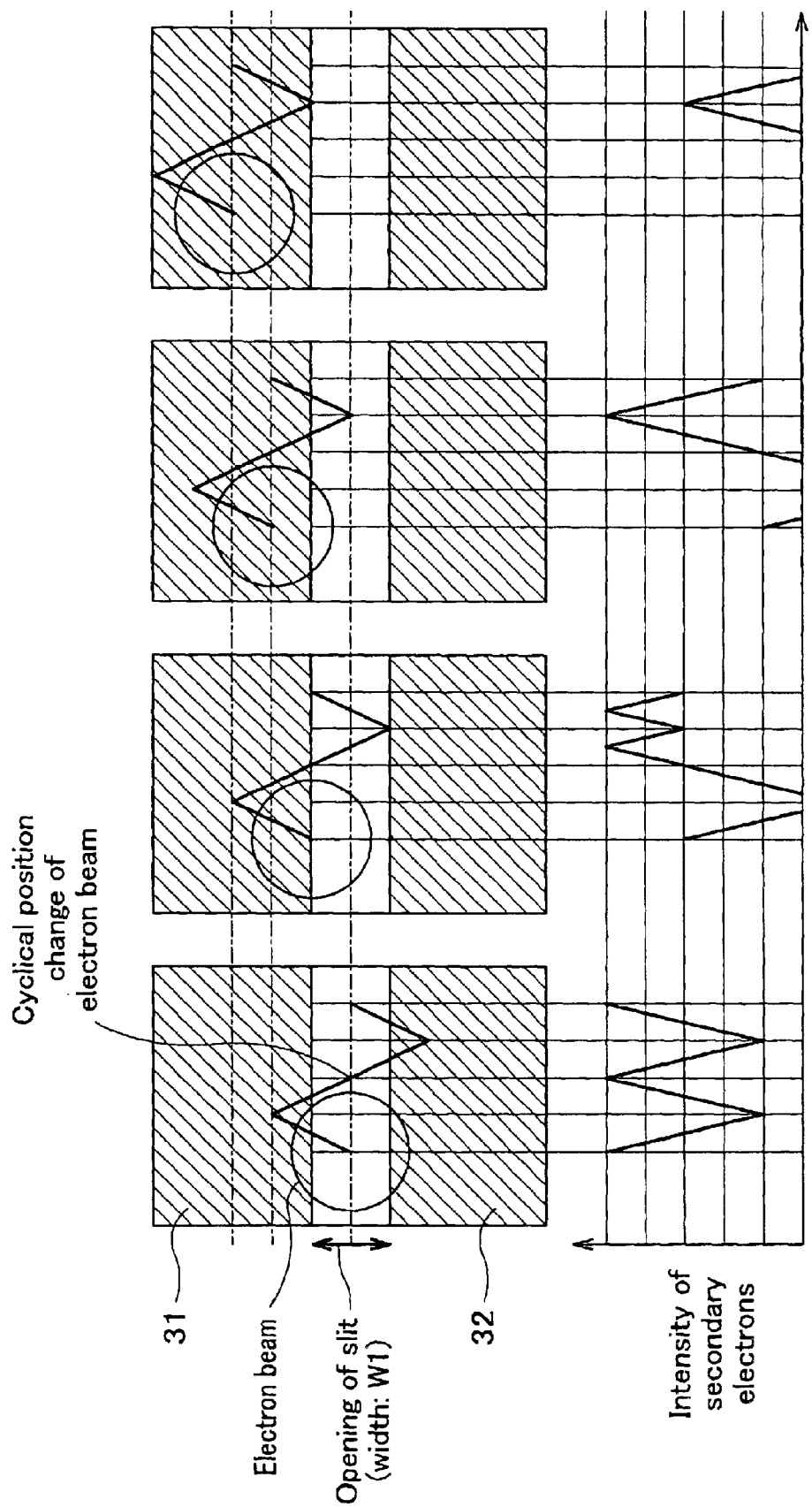
FIGS. 5A to 5D are diagrams showing a position of electron beam and intensity of secondary electrons.

An embodiment of a method for controlling the position of electron beam on a slit 7 accurately (Step 150) is described referring to FIGS. 4 and 5.

An electron beam on the slit 7 or at least one of upper and lower shields 31, 32 is shifted with a period $\omega$ and amplitude A5 (Step 151). A maximum intensity Is5 max of secondary electrons is measured by a secondary electron detector 15 or a maximum intensity If5 max of electron beam is measured by an energy filter electron beam detector 11 (Step 152). The amplitude A5 should be a half of the width W1 of opening of slit 7 or approximately same as W1. An analysis is performed for a period $\theta$ of intensity change of secondary electrons or electron beam (Step 153) and a judgment is made on whether or not the period $\theta$ is equal to 2$\omega$ (Step 154).

If the period $\theta$ is equal to 2$\omega$ a fine adjustment is completed (Step 155). If the period $\theta$ is equal to $\omega$, another adjustment should be performed. A method for detecting a position of electron beam on a slit is described first and then a method for the adjustment is described.

FIGS. 5A through 5D show an intensity change of secondary electrons and a position change of electron beam when the position of electron beam on slit 7 is cyclically oscillated with amplitude of W1.

FIG. 5A illustrates a case where the position of electron beam is in the center of opening of slit 7 when an oscillation is not applied.

FIG. 5B illustrates a case where the position of electron beam is at an end of the opening of slit 7 or the electron beam is at an end of upper shield 31.

FIG. 5C illustrates a case where the position of electron beam is shifted by W1×½ from the end of the opening of slit 7 toward the upper shield 31.

FIG. 5D illustrates a case where the position of electron beam is shifted by W1 from the end of the opening of slit 7 toward the upper shield 31.

As is obvious by these figures, the intensity change of secondary electrons has a period of 2$\omega$ only if the electron beam is in the center of opening of slit 7 and otherwise the period takes a value of $\omega$.

As shown in FIG. 5B, when an electron beam is at an end of the opening of slit 7, a maximum intensity Imax appears twice a period. If the electron beam shifts further away from the opening, the maximum intensity Imax appears only once a period as shown in FIG. 5C. If the electron beam shifts much further, the intensity of electron beam constantly takes a smaller value than the Imax as shown in FIG. 5D. In this way, it is possible to judge whether or not a fine adjustment is required according to a period of intensity change. It is also possible to know how much an electron beam on the slit 7 is offset from the center of the opening of slit 7 according to the number of appearances of the maximum intensity Imax in a period.

A method for a fine adjustment when a period $\theta$ of the intensity change of secondary electrons is not equal to 2$\omega$, for example $\theta = \omega$, is now described below.

A number N of appearances of the maximum intensity Imax of secondary electrons or electron beam in a period of $\omega$ is inspected by a secondary electron detector 15 or an energy filter electron beam detector 11, respectively (Step 156). If N is equal to two (N=2), one of the following adjustments should be made at Step 157. An analysis is performed for determining an amount of shifting of electron beam which maximizes the intensity of secondary electrons and then the electron beam is shifted accordingly. Alternatively, another analysis is performed for determining an amount of shifting of slit 7 which maximizes the intensity of electron beam and then the slit 7 is shifted accordingly. If N is equal to one or zero (N=1 or 0), the electron beam on the slit 7 is shifted toward the opening by a half of the width W1 thereof (Step 158). Subsequently, the flow returns to Step 152 where a measurement is performed for the intensity of secondary electrons or electron beam.

f. Observation of Electron Microscope After Fine Axis Adjustment

If a position and an incident angle of electron beam incident on an energy dispersion section 6 are changed by a deflection coil 4 as a result of the adjustment described above, another adjustment should be made to compensate the change with a deflection coil 9.

Since the position and angle of electron beam are corrected at both entrance and exit of energy filter 5, the electron beam is able to travel in the same trajectory as that which occurs while dispersion generated by the energy filter 5 is turned off. As a result, an energy width of electron beam passing through the energy filter 5 can be narrowed.

A probe of an electron beam with a narrow energy width is formed on a specimen 13 using an objective lens 12. The electron beam passing through the energy filter 5, which has a small energy width, can restrict the effect of chromatic aberration caused by the objective lens 12. As a result, the diameter of electron beam probe on the plane of specimen 13 can be reduced to approximately a half of that, which is achieved when an electron beam does not pass through an energy filter.

Scanning with an electron beam probe is performed two-dimensionally on the plain of specimen 13 by controlling an electron beam scanning coils 10. Secondary electrons 14 emitted by the specimen 13 is detected by the secondary electron detector 15 and an image of secondary electrons is observed by a signal analyzer 24. In this way, using a small electron beam probe, it is possible to observe an image of secondary electrons with higher spatial resolution.

While an observation of image of electron microscope is performed, checking is made for axial shifting of electron beam as required and a fine adjustment of axis should be made. Checking of axial shift based on change of intensity has the following steps: oscillating an electron beam on the slit 7 with a period $\omega$ and amplitude $2 \times W1$; measuring the intensity of secondary electrons with the secondary electron detector 15 or the intensity of electron beam with the energy filter electron beam detector 11. A judgment on shifting of electron beam is based on a period $\theta$ of intensity change and a number N of appearances of maximum intensity of electron beam. Checking in parallel with the observation facilitates maintaining higher resolution easily, thereby allowing a desirable observation with an electron microscope.

Though description has been made for a scanning electron microscope (SEM) exemplarily in the present embodiment, a same type of energy filter as the energy filter 5 can be used for a scanning transmission electron microscope (STEM). Therefore, the schematic diagram of the present embodiment shown in FIG. 1 can be applied to an STEM.

Figure 7:
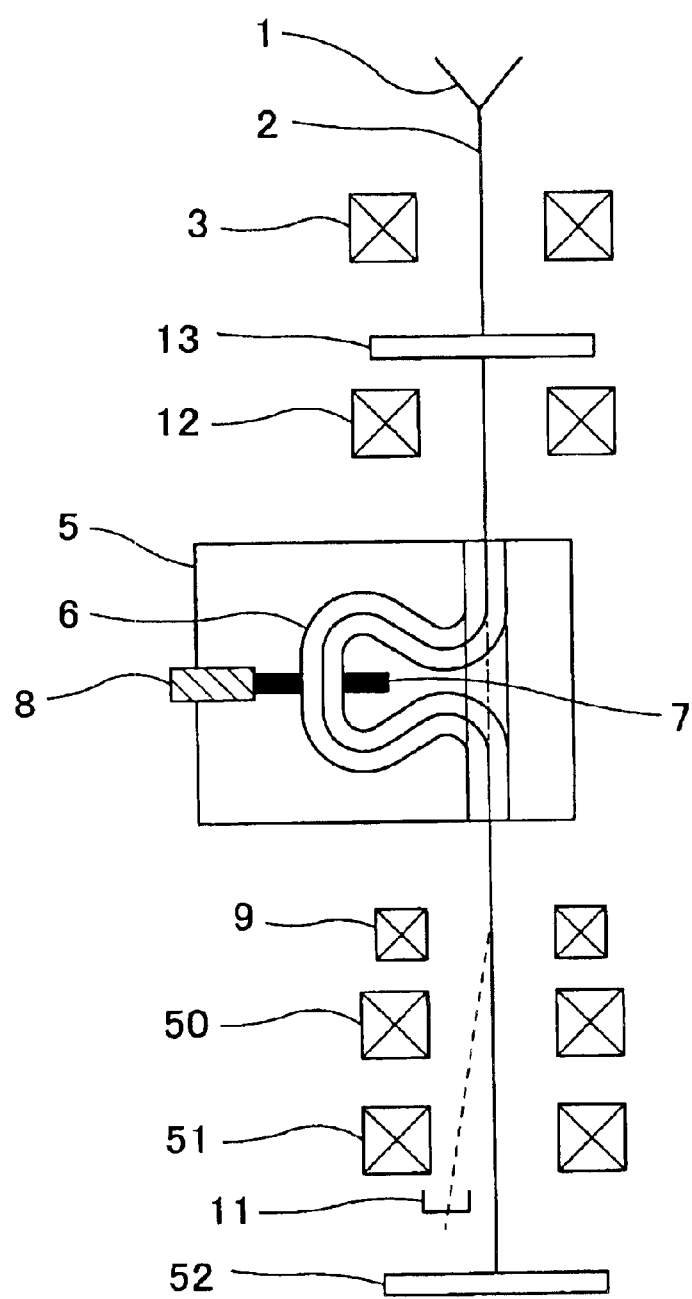
FIG. 7 is a schematic diagram showing major parts of an electron microscope according to another embodiment of the present invention.

FIG. 7 is a schematic diagram showing major parts of a transmission electron microscope according to another embodiment, which has an energy filter. An electron beam 2 generated by an electron beam source 1 is controlled by a condenser lens 3 and an objective lens 12, illuminating a specimen 13. The electron beam having transmitted through the specimen 13 enters an energy filter 5 where the electron beam undergoes energy dispersion made by an energy dispersion section 6 and energy selection executed by a slit 7. Subsequently, the electron beam, which is projected on a fluorescent screen 52 in an observation chamber through an intermediate lens 50 and a projection lens 51, is used for observing an image of electron microscope and measurement of electron beam energy loss spectrum. The energy filter 5 according to the present embodiment is same as that of the embodiment shown in FIG. 1.

Figure 8:
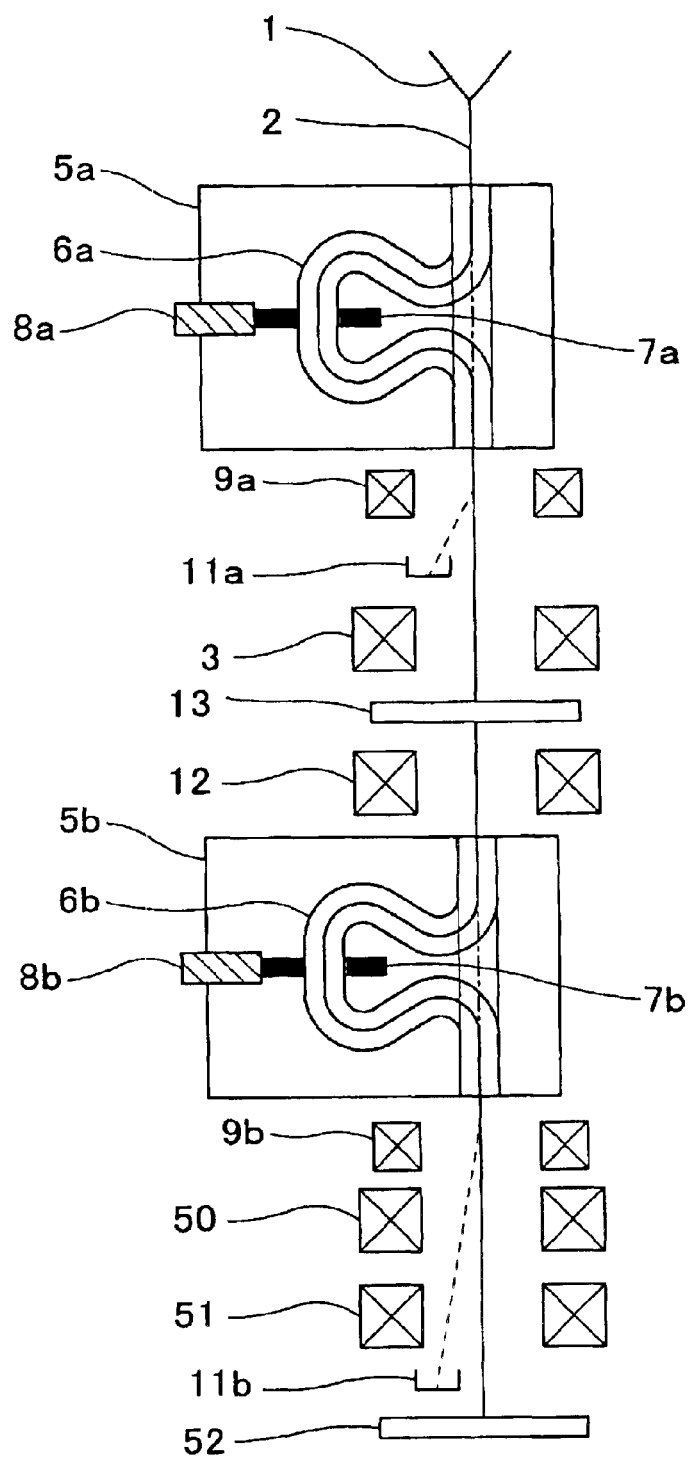
FIG. 8 is a schematic diagram showing major parts of an electron microscope according to the other embodiment of the present invention.

FIG. 8 is a schematic diagram showing a transmission electron microscope according to the other embodiment, which has two energy filters 5a and 5b. In the following description, the same numeral is used for a component which is the same as that described in the previous embodiment, with addition of a symbol "a" or "b" so as to identify to which of the two energy filters 5a and 5b the component is related. The transmission electron microscope includes an electron beam source 1, an energy dispersion section 6a which is disposed upstream a specimen 13 and narrows an energy width of electron beam generated by the electron beam source 1 and the other energy dispersion section 6b for analyzing the electron beam having transmitted through the specimen 13. In this connection, a detector for observing an image of electron microscope and the like are omitted. The transmission electron microscope according to the present embodiment illuminates an electron beam with a narrow energy width, thereby allowing an observation of image with higher spatial resolution. Furthermore, the transmission electron microscope can perform an energy analysis of electron beam having transmitted through the specimen, thereby providing an accurate image for element distribution and also an accurate image and spectrum for the state of chemical bonding.

What is claimed is:

1. An electron microscope comprising:
   an electron beam source for emitting an electron beam;
   an energy filter having an energy dispersion section for dispersing the electron beam according to electron energies, and a slit for selecting the electron beam dispersed by the energy dispersion section;
   an energy filter control unit;
   an objective lens; and
   an energy filter electron beam detector for detecting an amount of the electron beam selected by the energy filter,
   wherein the energy dispersion section is adapted selectively to turn on and off, the slit is disposed in a trajectory of the electron beam dispersed by the energy dispersion section and the electron beam bypasses the slit when the energy dispersion section is turned off, and
   wherein the energy filter control unit is able to adjust one of the trajectory of electron beam and a position of the slit according to a signal, which is generated as a result of cyclically shifting an area on the slit illuminated by the electron beam and detected by the energy filter electron beam detector, while the energy dispersion section is turned on.

2. The electron microscope according to claim 1 wherein the energy filter is disposed between the electron beam source and a specimen or downstream the specimen relative to a direction of traveling of the electron beam, and the electron beam selected by the energy filter is employed for observing the specimen.

3. An electron microscope comprising:
   an electron beam source for emitting an electron beam;
   an energy filter having an energy dispersion section for dispersing the electron beam according to electron energies, and a slit for selecting the electron beam dispersed by the energy dispersion section;
   an objective lens; and
   an energy filter electron beam detector for detecting an amount of the electron beam selected by the energy filter,
   wherein the electron microscope further comprises an energy filter control unit which is able to adjust one of the trajectory of electron beam and a position of the slit according to a signal, which is generated as a result of cyclically shifting an area on the slit illuminated by the electron beam and detected by the energy filter electron beam detector.

4. The electron microscope according to claim 3 wherein the energy filter control unit comprises:
   a shifting controller for cyclically shifting a position of the electron beam on the slit;

a signal analyzer for analyzing the position of the electron beam on the slit based on output signals delivered by the shifting controller and energy filter electron beam detector; and a deflection coil controller for controlling an energy filter deflection coil which controls positions of the electron beam at an entrance and an exit of the energy filter.

5. The electron microscope of claim 3, wherein the cyclical shifting of the area on the slit illuminated by the electron beam is carried out at a first period, and wherein the signal is generated from the detected electron beam by determining a period of the detected electron beam and comparing the determined period with the first period.

6. An electron microscope comprising:

an electron beam source for emitting an electron beam;

an energy filter having an energy dispersion section for dispersing the electron beam according to electron energies, and a slit for selecting the electron beam dispersed by the energy dispersion section;

an objective lens; and a secondary electron detector for detecting an amount of secondary electrons emitted by a specimen illuminated by the electron beam, wherein the energy dispersion section is adapted selectively to turn on and off and the electron microscope comprises an energy filter control unit which cyclically shifts an area on the slit illuminated by the electron beam while the energy dispersion section is turned on, thereby pinpointing the area based on signals delivered by the secondary electron detector, so that one of a trajectory of the electron beam and a position of the slit can be adjusted.

7. The electron microscope according to claim 6 further comprising a deflection coil for correcting the trajectory of the electron beam coming through an exit of the energy filter, and wherein the energy filter electron beam detector is adapted to dispose downstream the exit relative to a direction of traveling of the electron beam so that the energy filter electron beam detector does not intercept the trajectory of the electron beam.

8. A method for adjusting an electron microscope for observation of a specimen, comprising:

carrying out dispersion with an energy dispersion section according to electron energies for an electron beam before the electron beam illuminates the specimen or after the electron beam transmits through the specimen selecting the post-dispersion electron beam with an energy filter having a slit including at least two shields;

employing the electron beam selected with the energy filter for the observation of the specimen, wherein the method further comprises:

repeating shifting of a position of the selected electron beam on the slit at least once from a first position where the selected electron beam is intercepted more by a first shield than by a second shield, via an intermediate position where the selected electron beam is intercepted equally by the first and the second shield, to a second position where the selected electron beam is intercepted more by the second shield than by the first shield;

detecting the intensity of an electron beam passing through the slit as a result of the repeating step; and controlling the position of the electron beam on the slit according to change in the intensity.

9. The method according to claim 8 wherein the method further comprises:

shifting one of each shield and the whole slit back and forth at least once;

detecting the intensity of an electron beam passing through the opening of the slit corresponding to displacement of the slit; and controlling the position of the electron beam on the slit according to the displacement of the slit and a change in the intensity of the electron beam.

10. The method according to claim 8 wherein the method further comprises:

shifting an area illuminated by an electron beam by a larger distance than a width of the opening of the slit;

detecting the intensity of the electron beam passing through the opening of the slit corresponding to displacement of the electron beam; and controlling the position of the electron beam on the slit according to the displacement of the electron beam and a change in the intensity of the electron beam.

* * * * *